United States Patent
Park et al.

(10) Patent No.: US 10,199,166 B2
(45) Date of Patent: Feb. 5, 2019

(54) CAPACITOR

(71) Applicant: SAMSUNG ELECTRO-MECHANICS CO., LTD., Suwon-si, Gyeonggi-do (KR)

(72) Inventors: No Il Park, Suwon-si (KR); Byeong Cheol Moon, Suwon-si (KR); Il Ro Lee, Suwon-si (KR); Hyun Ho Shin, Suwon-si (KR); Seung Mo Lim, Suwon-si (KR); In Young Kang, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/806,112

(22) Filed: Nov. 7, 2017

(65) Prior Publication Data

US 2018/0342352 A1    Nov. 29, 2018

(30) Foreign Application Priority Data

May 29, 2017  (KR) .................. 10-2017-0066229

(51) Int. Cl.
  *H05K 1/00*  (2006.01)
  *H05K 1/18*  (2006.01)
  (Continued)

(52) U.S. Cl.
  CPC .............. *H01G 4/06* (2013.01); *H01G 4/228* (2013.01); *H01G 4/306* (2013.01); *H05K 1/181* (2013.01);
  (Continued)

(58) Field of Classification Search
  CPC ................ H01G 2/06; H01G 4/242; H01L 2224/16225; H01L 23/50; H01L 23/66; H01L 24/10; H01L 2924/14
  See application file for complete search history.

(56) References Cited

U.S. PATENT DOCUMENTS 6,437,385 B1 *  8/2002  Bertin ............... H01L 27/10861
                                                      257/301
7,265,995 B2 *  9/2007  Radhakrishnan ........ H01G 2/06
                                                      257/E23.021
(Continued)

FOREIGN PATENT DOCUMENTS

JP    2008-252001 A    10/2008
JP    4628794 B2       2/2011

OTHER PUBLICATIONS

Korean Notice of Office Action dated Jun. 27, 2018 issued in Korean Patent Application No. 10-2017-0066229 (with English translation).

*Primary Examiner* — Yuriy Semenenko
(74) *Attorney, Agent, or Firm* — McDermott Will & Emery LLP

(57) ABSTRACT

A capacitor includes: a substrate including a plurality of trenches and a capacitance formation portion, and a margin portion disposed around the capacitance formation portion; dielectric layers disposed on one surface of the substrate and filling the trenches; a plurality of first electrode layers each disposed on one surface of the dielectric layer and each including a first lead portion led out from the capacitance formation portion to the margin portion; and a plurality of second electrode layers each disposed on one surface of the dielectric layer to face the first electrode layer with each of the dielectric layers interposed therebetween, and each including a second lead portion led out from the capacitance formation portion to the margin portion, wherein the first (Continued)

and second lead portions of the plurality of first and second electrode layers are stacked in a stepped shape inclined in a direction from the margin portion to the capacitance formation portion.

20 Claims, 12 Drawing Sheets

(51) Int. Cl.
*H05K 7/00* (2006.01)
*H01G 4/06* (2006.01)
*H01G 4/30* (2006.01)
*H01G 4/228* (2006.01)

(52) U.S. Cl.
CPC .............. *H05K 2201/10015* (2013.01); *H05K 2203/041* (2013.01)

(56) References Cited

U.S. PATENT DOCUMENTS

| | | |
|---|---|---|
| 8,085,524 B2 | 12/2011 | Roozeboom et al. |
| 2004/0022038 A1* | 2/2004 | Figueroa ............... H01L 23/642 |
| | | 361/763 |
| 2008/0237794 A1* | 10/2008 | Shoji ...................... H01G 4/012 |
| | | 257/532 |
| 2013/0161792 A1 | 6/2013 | Tran et al. |
| 2014/0374880 A1* | 12/2014 | Chen ................. H01L 27/10829 |
| | | 257/532 |
| 2016/0020267 A1 | 1/2016 | Lin |

\* cited by examiner

CAPACITOR

CROSS-REFERENCE TO RELATED APPLICATION(S)

This application claims benefit of priority to Korean Patent Application No. 10-2017-0066229 filed on May 29, 2017 in the Korean Intellectual Property Office, the disclosure of which is incorporated herein by reference in its entirety.

BACKGROUND

1. Field

The present disclosure relates to a capacitor having a trench.

2. Description of Related Art

Recently, portable information technology (IT) products such as smartphones, wearable devices, and the like, have been thinned. Therefore, the necessity for thinning passive elements in order to decrease a thickness of an overall package has increased.

To this end, demand for a thin-film capacitor allowing for a thinner thickness, as compared to a multilayer ceramic capacitor, has also increased.

The thin-film capacitor has an advantage in that a thin capacitor may be implemented by using a thin film technology.

Further, since the thin-film capacitor has an advantage in that it has low equivalent series inductance (ESL), unlike a multilayer ceramic capacitor according to the related art, recently, the application of a thin-film capacitor as a decoupling capacitor has been considered for use as an application processor (AP).

In order to use a thin-film capacitor as a decoupling capacitor for an application processor (AP) as described above, a thin-film capacitor has been manufactured to have the form of a land-side capacitor (LSC).

However, in a case of an existing embedded-type capacitor, it is impossible to rework the capacitor in the case of a capacitor defect, such that total loss cost is significantly increased. Therefore, there is a need to implement a thin-film ceramic capacitor in a form of a reworkable land-side capacitor (LSC).

Meanwhile, since a LSC type thin-film capacitor is disposed between solder balls, a thin-film capacitor should be designed to have a size as small as possible to significantly decrease a solder ball removal area.

At the same time, in order to increase capacitance of a thin-film capacitor, research into a technology for applying a trench type structure capable of increasing a surface area, to contribute to implementing capacitance to the thin-film capacitor, has been conducted.

SUMMARY

An aspect of the present disclosure may provide a capacitor having a structure capable of significantly increasing capacitance of the capacitor and significantly decreasing the number of connection electrode layers.

According to an aspect of the present disclosure, a capacitor may include: a substrate including a plurality of trenches and a capacitance formation portion, and a margin portion disposed around the capacitance formation portion; dielectric layers disposed on one surface of the substrate and filling the trenches; a plurality of first electrode layers each disposed on one surface of the dielectric layer and each including a first lead portion led out from the capacitance formation portion to the margin portion; and a plurality of second electrode layers each disposed on one surface of the dielectric layer to face the first electrode layer with each of the dielectric layers interposed therebetween, and each including a second lead portion led out from the capacitance formation portion to the margin portion, wherein the first and second lead portions of the plurality of first and second electrode layers are stacked in a stepped shape inclined in a direction from the margin portion to the capacitance formation portion.

According to another aspect of the present disclosure, a capacitor may include: a plurality of cells including a plurality of trenches disposed in a substrate, a capacitance formation portion in which the trench is disposed, and a margin portion disposed around the capacitance formation portion, wherein each of the cells includes dielectric layers disposed in the capacitance formation portion to be filled in the trenches and first and second electrode layers alternately disposed with each of the dielectric layers interposed therebetween, the first electrode layer including a first lead portion led out from the capacitance formation portion to the margin portion; and the second electrode layer including a second lead portion led out from the capacitance formation portion to the margin portion, and the first and second lead portions of the first and second electrode layers being stacked in a stepped shape inclined in a direction from the margin portion to the capacitance formation portion.

According to another aspect of the present application, a board may comprise a circuit board, a semiconductor chip disposed on one surface of the circuit board, and a capacitor disposed on the other surface of the circuit board, wherein the capacitor may comprise ing: a substrate including a plurality of trenches, a capacitance formation portion, and a margin portion disposed around the capacitance formation portion; dielectric layers disposed on one surface of the substrate and filling the trenches; a plurality of first electrode layers each disposed on one surface of the dielectric layer and each including a first lead portion led out from the capacitance formation portion to the margin portion; and a plurality of second electrode layers each disposed on one surface of the dielectric layer to face the first electrode layer with each of the dielectric layers interposed therebetween, and each including a second lead portion led out from the capacitance formation portion to the margin portion, wherein the first and second lead portions of the plurality of first and second electrode layers are stacked in a stepped shape inclined in a direction from the margin portion to the capacitance formation portion.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

X, Y, and Z directions illustrated in the accompanying drawings may refer to length, width, and thickness directions, respectively, or be sequentially represented by first, second, and third directions, respectively.

Figure 1:
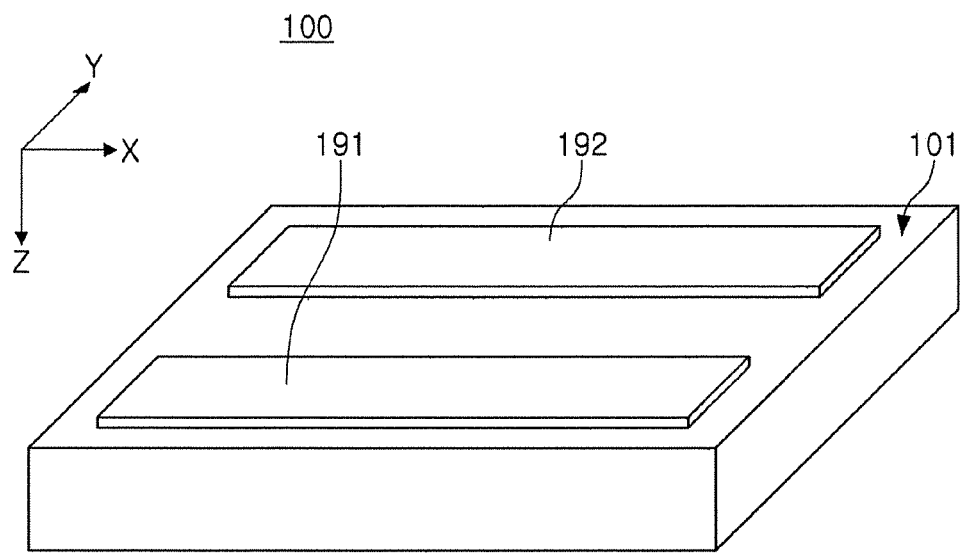
FIG. 1 shows a schematic perspective view illustrating a capacitor according to an exemplary embodiment in the present disclosure.
Figure 2:
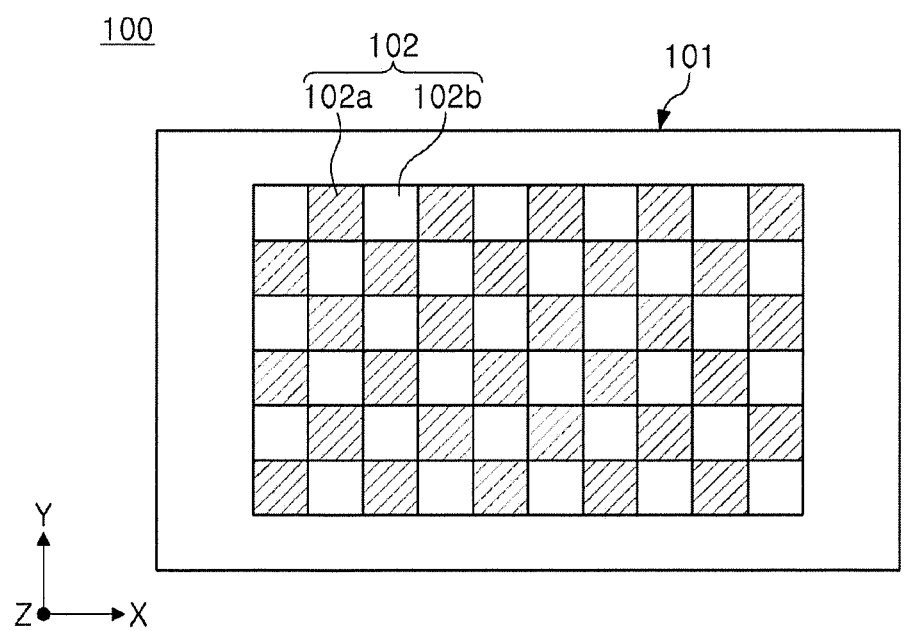
FIG. 2 shows a schematic plan view illustrating a capacitor according to an exemplary embodiment in the present disclosure.
Figure 3:
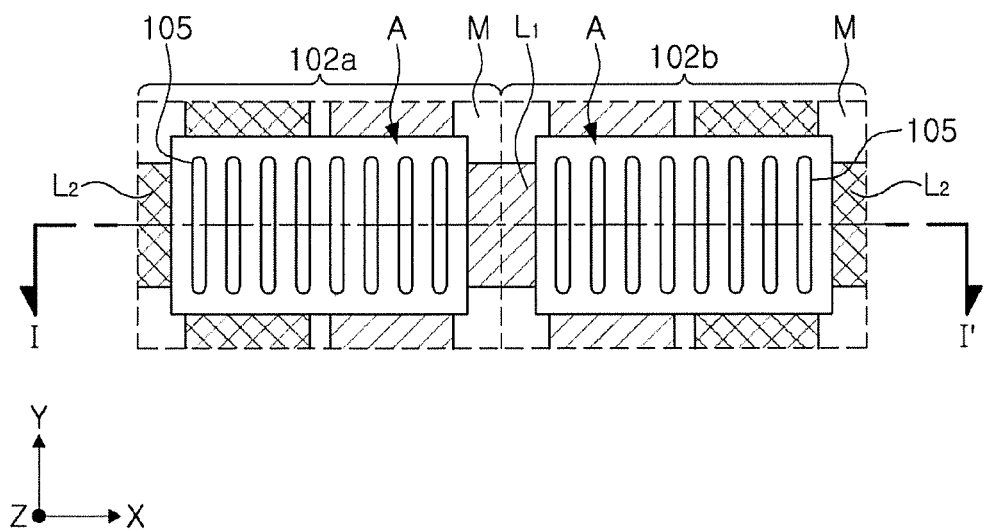
FIG. 3 shows a schematic enlarged plan view illustrating four cells in the plan view of FIG. 2.
Figure 4:
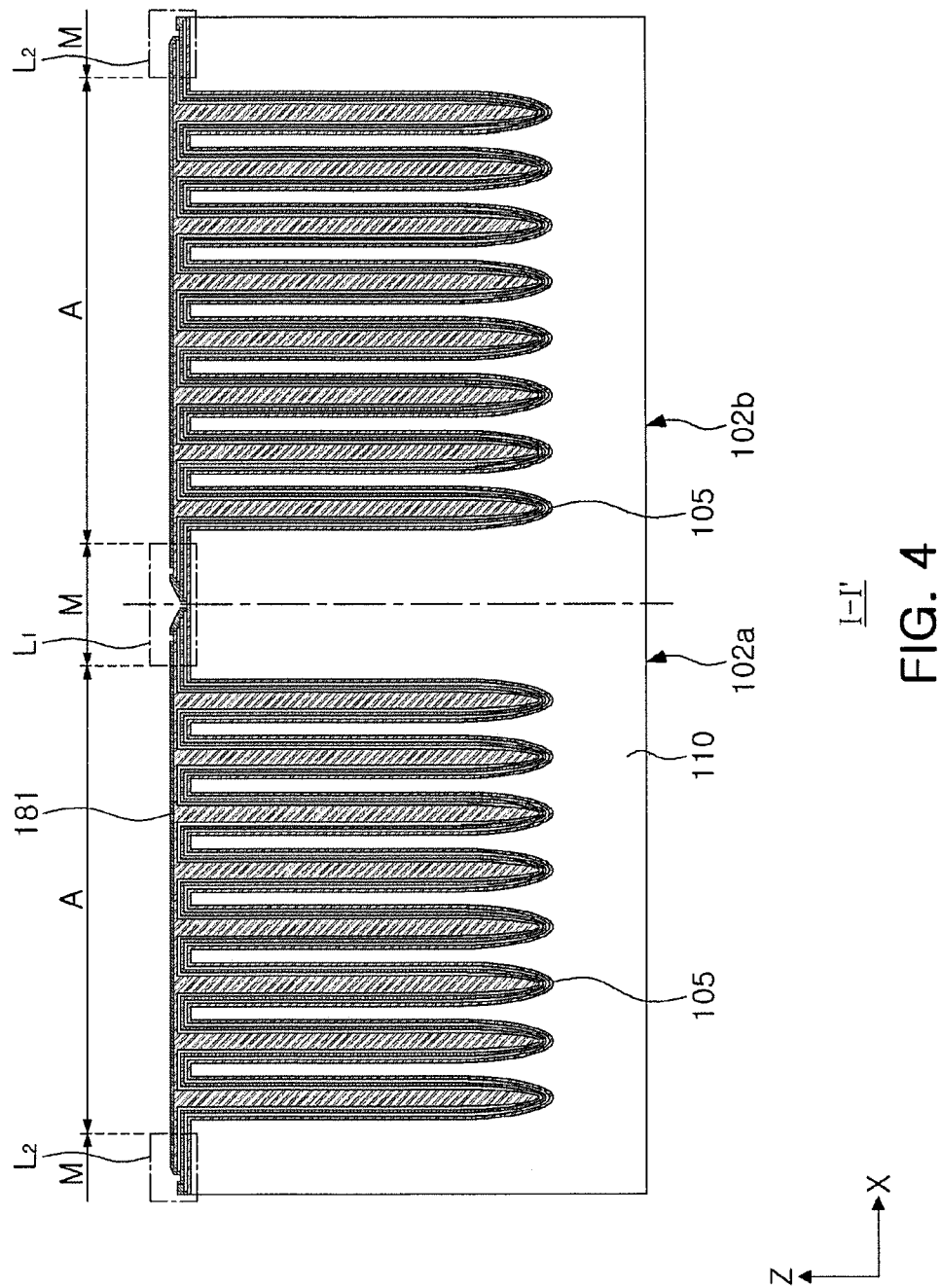
FIG. 4 shows a schematic cross-sectional view taken along line I-I' of FIG. 3.

FIG. 1 shows a schematic perspective view illustrating a capacitor according to an exemplary embodiment in the present disclosure, and FIG. 2 shows a schematic plan view illustrating a capacitor according to an exemplary embodiment in the present disclosure. Further, FIG. 3 shows a schematic enlarged plan view illustrating four cells in the plan view of FIG. 2, and FIG. 4 shows a schematic cross-sectional view taken along line I-I' of FIG. 3.

Hereinafter, a capacitor 100 according to the exemplary embodiment in the present disclosure will be descried with reference to FIGS. 1, 2, 3 and 4.

The capacitor 100 according to the exemplary embodiment in the present disclosure may include a body 101 and first and second external electrodes 191 and 192 disposed on an outer surface of the body.

A shape of the body 101 is not particularly limited, but generally, may be a hexahedral shape. Further, the body 101 is not particularly limited in view of dimensions, but may have, for example, a size of 0.6 mm×0.3 mm and may be a highly stacked and may be a high-capacitance thin-film capacitor of 1.0 μF or more.

The body 101 may include a substrate 110. The substrate 110 may be formed of any one selected from the group consisting of Si, $SiO_2$, $Al_2O_3$, MgO, $LaAlO_3$, and $SrTiO_3$, or a combination thereof. For example, as the substrate 110, a silicon wafer may be used.

The substrate 110 may include a capacitance formation portion A and a margin portion M disposed around the capacitance formation portion A on one surface of the substrate 110. The capacitance formation portion A and the margin portion M may configure a single cell 102a or 102b. The capacitor 100 according to the exemplary embodiment in the present disclosure may include a plurality of cells 102a and 102b.

A plurality of trenches 105 formed from one surface of the substrate 110 to an interior of the substrate 110 may be disposed in the substrate 110. For example, the plurality of trenches 105 may be disposed in the capacitance formation portion A.

The trench 105 may be formed by etching one surface of the substrate 110.

The trenches 105 may be formed to be elongated in the first (X) direction or the second (Y) direction perpendicular to the first (X) direction, or be regularly formed at a predetermined interval in the first (X) direction or the second (Y) direction. However, in the present disclosure, a description will be provided on the basis on a case in which the trenches 105 are formed to be elongated in the second (Y) direction and are regularly formed at a predetermined interval in the first (X) direction (see FIG. 3).

First and second electrode layers 121 and 122 alternately disposed with a dielectric layer 111 or 112 may be disposed on one surface of the substrate 110 and in the trench 105.

The capacitor 100 according to the exemplary embodiment in the present disclosure may include one or more dielectric layers 111 and 112. For example, referring to FIG. 4, in a case in which two dielectric layers 111 and 112 included in the capacitor 100, the first electrode layer 121, a first dielectric layer 111, the second electrode layer 122, a second dielectric layer 112, and the first electrode layer 121 may be sequentially stacked on one surface of the substrate 110 and in the trench 105.

The first and second electrode layers 121 and 122 may be formed of a conductive material. A material of the first and second electrode layers 121 and 122 may be determined depending on a material of the dielectric layers 111 and 112. In a case in which the dielectric layers 111 and 112 are formed of a paraelectric material such as a metal oxide, or the like, the material of the first and second electrode layers 121 and 122 may include a metal nitride. For example, the first and second electrode layers 121 and 122 may be formed of TiN, but are not limited thereto.

The first and second electrode layers 121 and 122 may be formed using an atomic layer deposition (ALD) method or an atomic vapor deposition (AVD) method, but are not limited thereto.

The dielectric layers 111 and 112 maybe formed of the paraelectric material such as the metal oxide, or the like. The dielectric layers 111 and 112 may contain any one of the metal oxides such as $Al_2O_3$, $ZrO_2$, $HfO_2$, and the like, or a combination thereof. The dielectric layers 111 and 112 may contain and be formed of the metal oxide such as $Al_2O_3$, $ZrO_2$, $HfO_2$, or the like, as a single material. Unlike this, the dielectric layers 111 and 112 may also be formed of a composite layer in order to improve electric leakage properties. In a case in which the dielectric layers 111 and 112 are formed of the composite layer, the dielectric layers 111 and 112 may be $ZrO_2$-$Al_2O_3$-$ZrO_2$ composite layers.

The dielectric layers 111 and 112 may be formed using an atomic layer deposition (ALD) method or an atomic vapor deposition (AVD) method, but are not limited thereto.

The first and second electrode layers 121 and 122 may be disposed to face each other with the dielectric layer 111 or 112 interposed therebetween, such that the capacitor may operate when voltages having different polarities are applied to the first and second electrode layers 121 and 122, respectively.

Therefore, the first and second electrode layers 121 and 122 may be alternately disposed with the dielectric layer 111 or 112 interposed therebetween in the capacitance formation portion A, thereby having a metal-insulator-metal (MIM) structure.

An insulating layer 181 may be disposed on the MIM structure to cover upper portions of the dielectric layers 111 and 112 and the first and second electrode layers 121 and 122. The insulating layer 181 may be formed of the silicon oxide ($SiO_2$), but is not limited thereto.

The first electrode layer 121 may include a first lead portion $L_1$ led out from the capacitance formation portion A to the margin portion M, and the second electrode layer 122 may include a second lead portion $L_2$ led out from the capacitance formation portion A to the margin portion M.

Figure 5A:
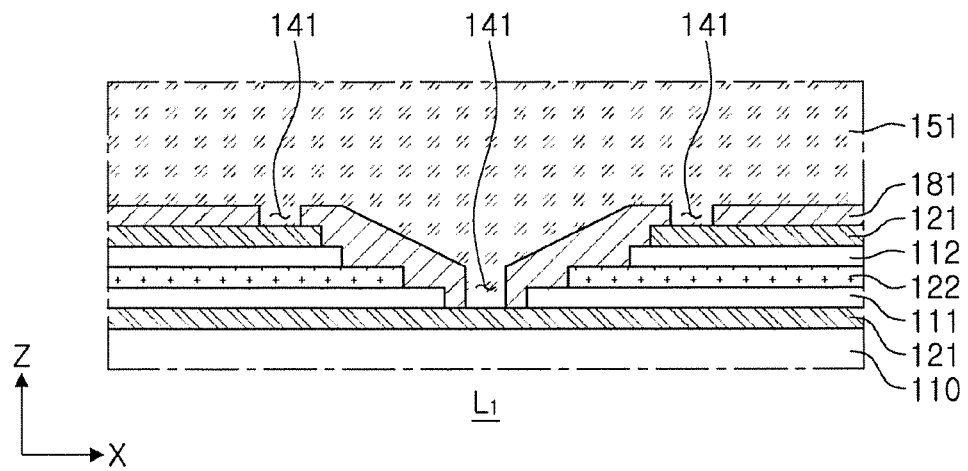
FIG. 5A shows a schematic enlarged cross-sectional view illustrating a first lead portion.
Figure 5B:
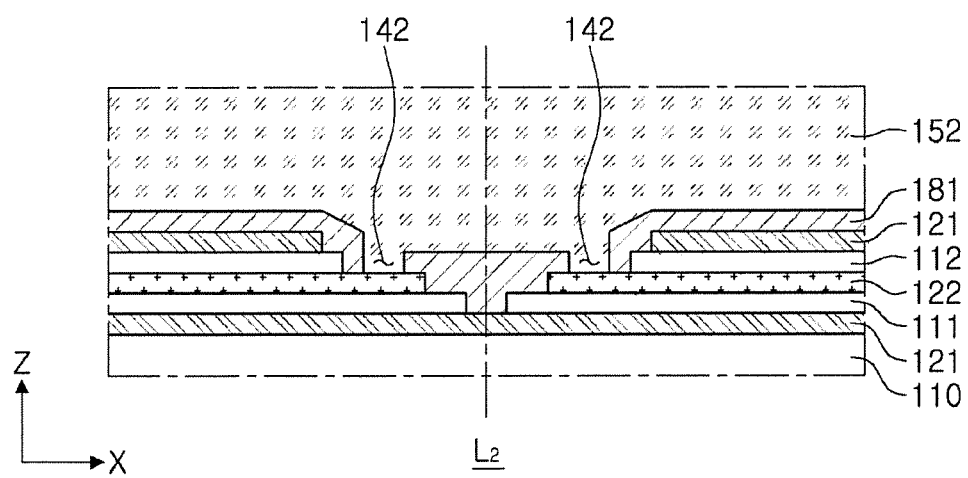
FIG. 5B shows a schematic enlarged cross-sectional view illustrating a second lead portion.

FIG. 5A shows a schematic enlarged cross-sectional view illustrating the first lead portion $L_1$, while FIG. 5B shows a schematic enlarged cross-sectional view illustrating the second lead portion $L_2$.

Referring to FIGS. 5A and 5B, the first and second lead portions $L_1$ and $L_2$ may be formed in a stepped shape inclined from the margin portion M to the capacitance formation portion A. Among the plurality of cells 102a and 102b, one of a pair of cells 102a and 102b adjacent to each other may be defined as a first cell 102a, and the other thereof may be defined as a second cell 102b. Further, based on a central portion of each of the first and second cells 102a and 102b, a region in which the first and second cells 102a and 102b come in contact with each other may be a first region, and the remaining region may be a second region. Here, the first lead portion $L_1$ may be disposed in the first region, and the second lead portion $L_2$ may be disposed in the second region.

In the first lead portion $L_1$, the first electrode layer 121, the first dielectric layer 111, the second electrode layer 122, the second dielectric layer 112, and the first electrode layer 121 may be sequentially stacked from a bottom in the stacking direction, but the first lead portion $L_1$ may have a stepped shape from the margin portion M to the capacitance formation portion A from the bottom in the stacking direction.

The dielectric layer 111 or 112, or the second electrode layer 122 may not be disposed on at least a portion of one surface of the first electrode layer 121 among configurations of the first lead portion $L_1$ having the stepped shape. The first electrode layer 121 may serve as a tread among configurations of a step portion, and one end portions of the first electrode layer 121, the second electrode layer 122, and the dielectric layers 111 and 112 may serve as risers, among the configurations of the step portion. However, the first electrode layer 121, the second electrode layer 122, and the dielectric layers 111 and 112 are not limited thereto, but the second electrode layer 122 and the dielectric layers 111 and 112 as well as the first electrode layer 121 in the first lead portion $L_1$ having the stepped shape may also serve as the tread.

In the first insulating layer 181 disposed on the first lead portion $L_1$, a first opening 141 may be disposed in a position corresponding to the first lead portion $L_1$. For example, the first opening 141 may be disposed on one surface of the first electrode layer 121.

Referring to FIG. 5A, a first connection electrode layer 151 may be disposed on the first lead portion $L_1$. Here, the first connection electrode layer 151 may be connected to the first lead portion $L_1$ through the first opening 141. More specifically, the first connection electrode layer 151 may be connected to the first electrode layer 121 through the first opening 141.

In the second lead portion $L_2$, the first electrode layer 121, the first dielectric layer 111, the second electrode layer 122, the second dielectric layer 112, and the first electrode layer 121 may be sequentially stacked from a bottom in the stacking direction, but the second lead portion $L_2$ may have a stepped shape from the margin portion M to the capacitance formation portion A from the bottom in the stacking direction.

The dielectric layer 111 or 112, or the first electrode layer 121 may not be disposed on at least a portion of one surface of the second electrode layer 122 among configurations of the second lead portion $L_2$ having the stepped shape. The second electrode layer 122 may serve as a tread among configurations of a step portion, and one end portions of the first electrode layer 121, the second electrode layer 122, and the dielectric layers 111 and 112 may serve to risers among the configurations of the step portion. However, the first electrode layer 121, the second electrode layer 122, and the dielectric layers 111 and 112 are not limited thereto, but the first electrode layer 121 and the dielectric layers 111 and 112 as well as the second electrode layer 122 in the second lead portion $L_2$ having the stepped shape may also serve as the tread.

In the first insulating layer 181 disposed on the second lead portion $L_2$, a second opening 142 may be disposed in a position corresponding to the second lead portion $L_2$. For example, the second opening 142 may be disposed on one surface of the second electrode layer 122.

Referring to FIG. 5B, a second connection electrode layer 152 may be disposed on the second lead portion $L_2$. Here, the second connection electrode layer 152 may be connected to the second lead portion $L_2$ through the second opening 142. More specifically, the second connection electrode layer 152 may be connected to the second electrode layer 122 through the second opening 142.

In a trench type capacitor according to the related art, first and second electrode layers and connection electrode layers are connected to each other through a via having a diameter of about 0.25 to 0.5 μm. That is, in a case of using a via as in the related art, there is a need to separately form vias using a laser, or the like, and fill each of the vias with a conductive material. In this case, there is a problem in that equivalent series resistance of a capacitor may be increased due to a small diameter of the vias. However, in the capacitor 100 according to the exemplary embodiment in the present disclosure, since the first and second electrode layers are connected to the first and second connection electrode layers, respectively, using the openings, the openings may be simply formed, as compared to the related art, and a wider contact area may be secured, such that equivalent series resistance may be decreased.

Further, in the trench type capacitor according to the related art, a plurality of connection electrode layers have been required in order to connect external electrodes and each of the electrode layers. The plurality of connection electrode layers as described above may cause an increase in thickness of the trench type capacitor. However, since the capacitor according to the exemplary embodiment in the present disclosure uses the first and second lead portions $L_1$ and $L_2$ having the stepped shapes, each of the first and second connection electrode layers 151 and 152 may be formed of a single layer. Therefore, the capacitor may be thinned by significantly decreasing an influence of the first and second connection electrode layers 151 and 152 to a thickness of the capacitor 100.

Figure 6A:
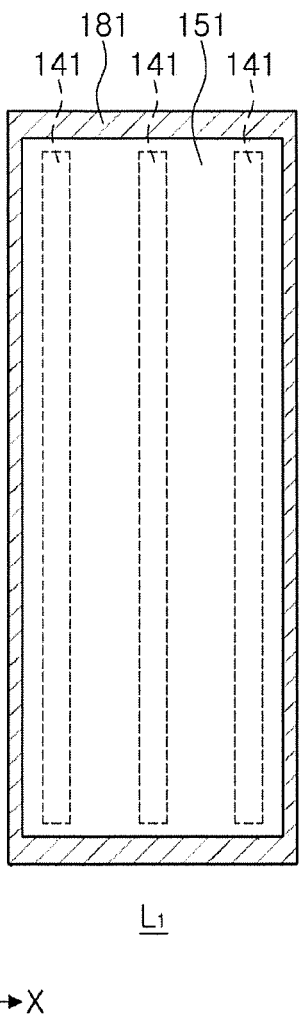
FIG. 6A shows a schematic plan view illustrating the first lead portion.
Figure 6B:
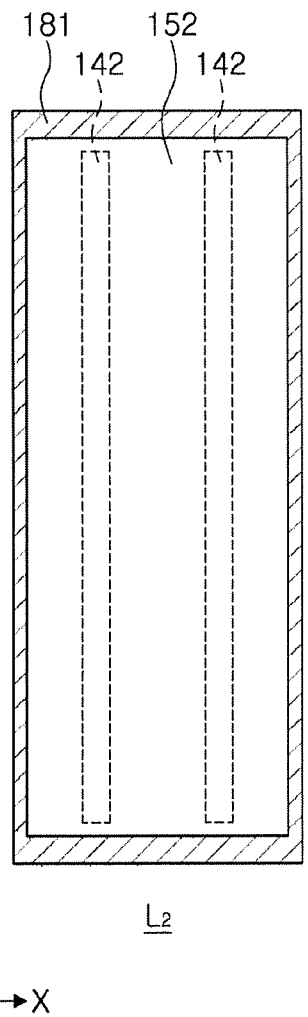
FIG. 6B shows a schematic plan view illustrating the second lead portion.

FIG. 6A shows a schematic plan view illustrating the first lead portion, and FIG. 6B shows a schematic plan view illustrating the second lead portion.

Referring to FIGS. 6A and 6B, the first and second openings 141 and 142 may be disposed to be elongated in one direction. That is, since the first and second electrode layers are connected to the first and second connection electrode layers, respectively, through the first and second openings 141 and 142 formed to be elongated in one direction instead of circular vias as in the related art, equivalent series resistance of the capacitor may be significantly decreased.

For example, the first and second openings 141 and 142 may be elongatedly formed to correspond to a boundary between the capacitance formation portion A and the margin portion M, such that equivalent series resistance of the capacitor may be significantly decreased.

Figure 7:
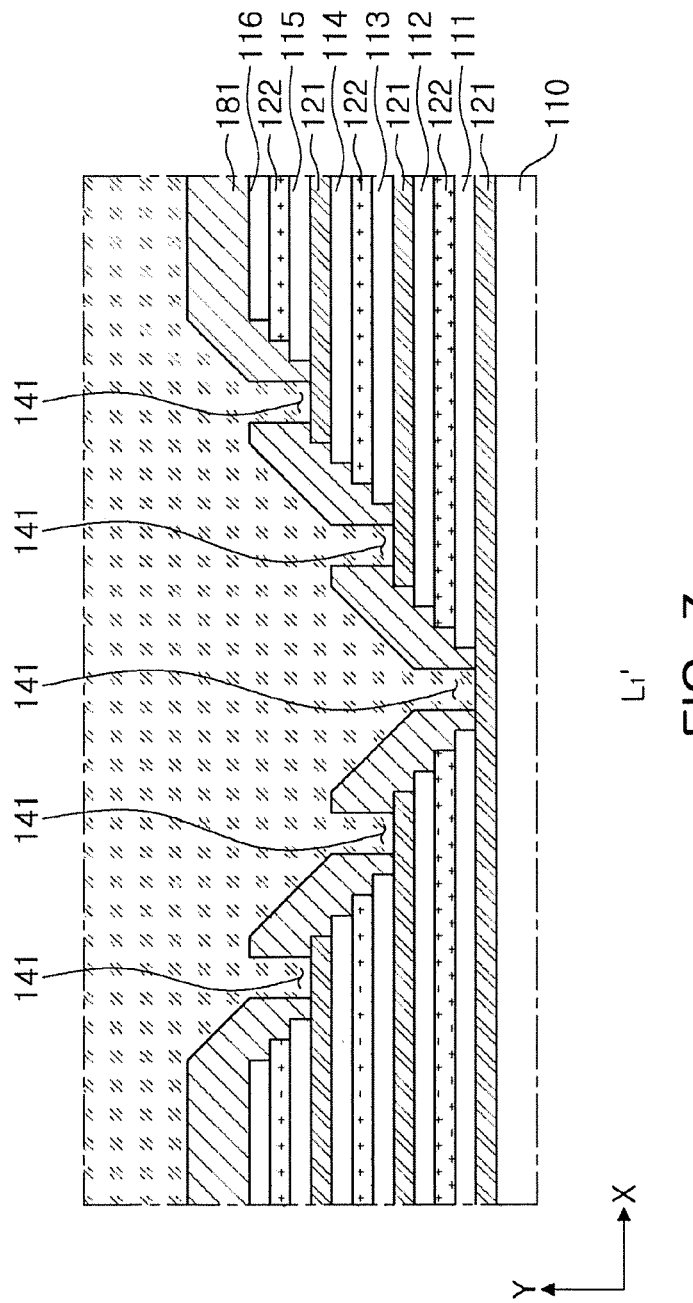
FIG. 7 shows a schematic cross-sectional view illustrating a first lead portion of a capacitor according to another exemplary embodiment in which the number of dielectric layers is 3 or more.

FIG. 7 shows a schematic cross-sectional view illustrating a first lead portion L1' of a capacitor according to another exemplary embodiment in which the number of dielectric layers is 3 or more.

Referring to FIG. 7, the capacitor according to another exemplary embodiment in the present disclosure may include first to sixth dielectric layers 111 to 116.

In a case in which a capacitor includes three or more dielectric layers as described above, in a trench type capacitor according to the related art, the number of connection electrode layers needs to be increased to 2 or more in order to connect the electrode layers increased corresponding to the number of dielectric layers to external electrodes, respectively. When the number of connection electrode layers is increased as described above, a thickness of the capacitor may be increased.

However, since the capacitor according to another exemplary embodiment in the present disclosure uses a first lead portion $L_1'$ having a stepped shape, a first connection electrode layer 151 may be formed of a single layer. This may be equally applied to a second lead portion and a second connection electrode layer. Therefore, even though the capacitor according to another exemplary embodiment in the present disclosure includes three or more dielectric layers, an influence of the first and second connection electrode layers on a thickness of the capacitor may be significantly decreased, such that the capacitor may be thinned.

Figure 8:
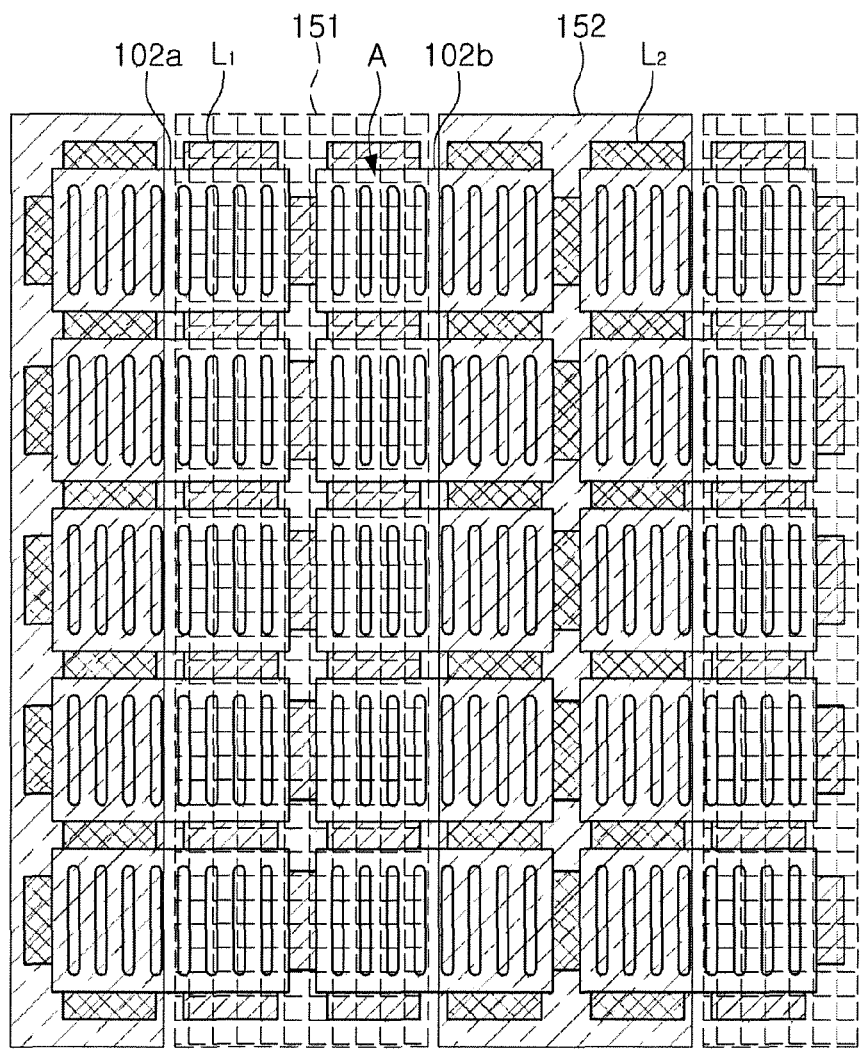
FIGS. 8 and 9 show schematic plan views illustrating first and second connection electrode layers formed on a plurality of cells in the capacitor according to the exemplary embodiment in the present disclosure.

FIG. 8 shows a schematic plan view illustrating first and second connection electrode layers formed on a plurality of cells in the capacitor according to the exemplary embodiment in the present disclosure.

Referring to FIG. 8, among the plurality of cells 102a and 102b, one of a pair of cells 102a and 102b adjacent to each other may be defined as a first cell 102a, and the other thereof may be defined as a second cell 102b. Further, based on a central portion of each of the first and second cells 102a and 102b, a region in which the first and second cells 102a and 102b come in contact with each other may be a first region, and the remaining region may be a second region. Here, the first lead portion $L_1$ may be disposed in the first region, and the second lead portion $L_2$ may be disposed in the second region.

In order to decrease equivalent series inductance (ESL) of the capacitor 100, to the manner in which the connection electrode layers of the capacitor 100 are disposed is significantly important. That is, there is a need to dispose positive (+) and negative (−) polarities implementing capacitance in consideration of a flow of electricity. There was an attempt to decrease ESL in consideration of the flow of electricity as described above in the capacitor according to the related art in which connection electrode layers and respective electrode layers were connected to each other through vias. However, due to structural limitations of the trench type capacitor, there was a problem in that symmetry with respect to respective cells was significantly low.

However, in the capacitor 100 according to the exemplary embodiment in the present disclosure, the first and second connection electrode layers 151 and 152 may be formed to be elongated in one direction and alternately disposed as illustrated in FIG. 8, such that symmetry of the connection electrode layers may be significantly increased and thus ESL may be significantly decreased.

Here, it may be confirmed that only the first lead portion $L_1$ is disposed in a position corresponding to the first connection electrode layer 151 and only the second lead portion $L_2$ is disposed in a position corresponding to the second connection electrode layer 152.

Figure 9:
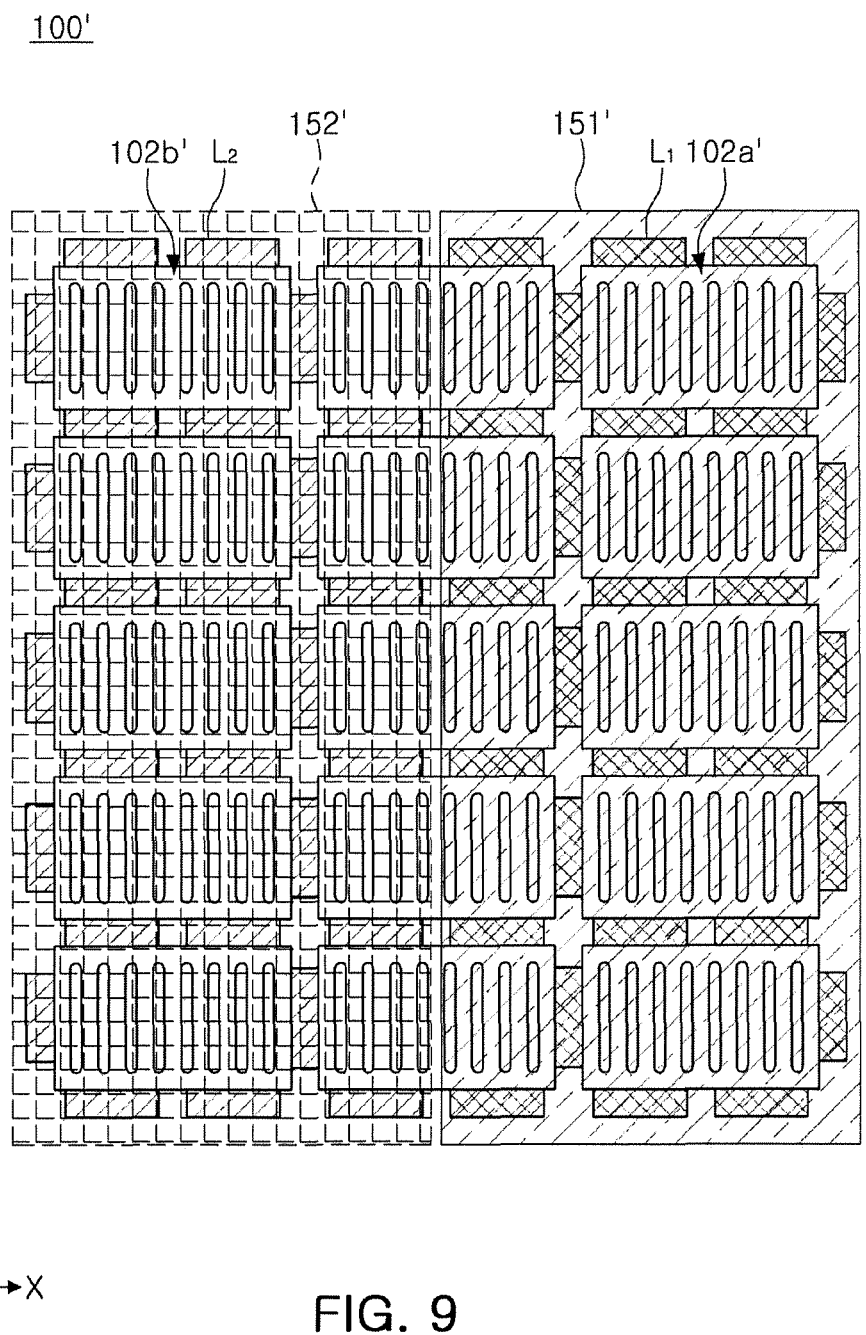

FIG. 9 shows a schematic plan view illustrating first and second connection electrode layers formed on a plurality of cells in the capacitor according to the exemplary embodiment in the present disclosure. Unlike the first and second connection electrode layers in FIG. 8, first and second connection electrode layers 151' and 152' in FIG. 9 may be disposed to completely cover one or more cells 102a' or 102b'. In this case, a first cell 102a' may be disposed to include only a first lead portion $L_1$, and a second cell 102b' may be disposed to include only the second lead portion $L_2$.

The first and second electrode layers 151' and 152' may be formed to be elongated in one direction and alternately disposed as illustrated in FIG. 9, such that symmetry of the connection electrode layers maybe significantly increased and thus ESL may be significantly decreased.

FIGS. 10A, 10B, 10C, 11A, 11B, 11C, 12A, 12B, and 12C are schematic plan view illustrating a structure in which first and second connection electrode layers and first and second external electrodes are connected to each other.

The structure in which the first and second connection electrode layers and the first and second external electrodes are connected to each other will be described with reference to FIGS. 10A, 10B, 10C, 11A, 11B, 11C, 12A, 12B, and 12C.

Figure 10A:
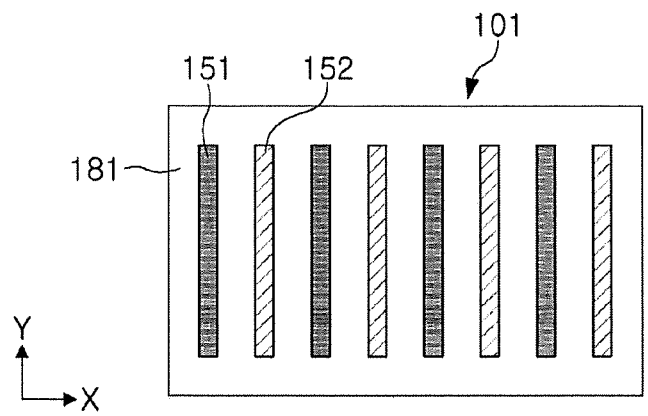
FIGS. 10A, 10B, 10C, 11A, 11B, 11C, 12A, 12B, and 12C show schematic plan views illustrating a structure in which first and second connection electrode layers and first and second external electrodes are connected to each other.
Figure 10B:
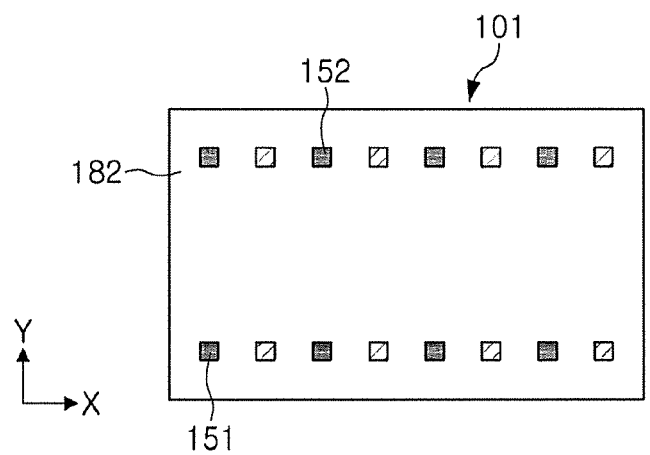
Figure 10C:
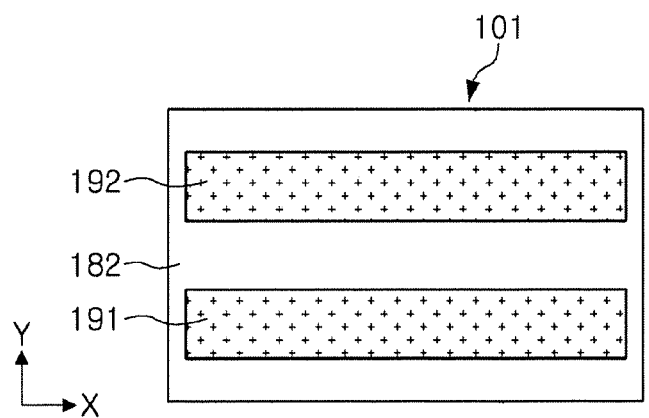

Referring to FIG. 10A, the first and second connection electrode layers 151 and 152 may be formed to be elongated in the Y direction and alternately disposed in the X direction on the first insulating layer 181. A second insulating layer 182 may be disposed on the first and second connection electrode layers 151 and 152. The second insulating layer 182 may partially expose the first and second connection electrode layers 151 and 152 in the X direction through openings as illustrated in FIG. 10B. Referring to FIG. 10C, the first external electrode 191 may be disposed in the X direction to cover the exposed first connection electrode layer 151, and the second external electrode 192 maybe disposed in the X direction to cover the exposed second connection electrode layer 152.

The first and second external electrodes 191 and 192 may be formed using a paste containing a conductive material. If necessary, the first and second external electrodes 191 and 192 may further include plating layers formed thereon.

Figure 11A:
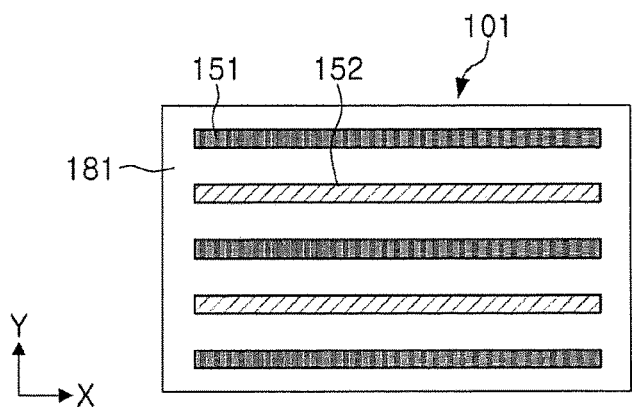
Figure 11B:
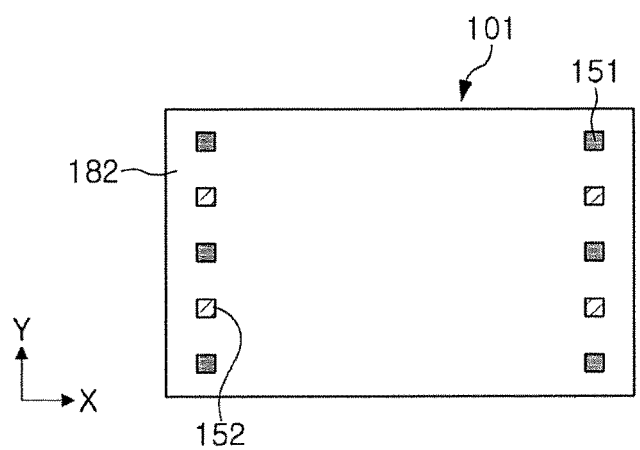
Figure 11C:
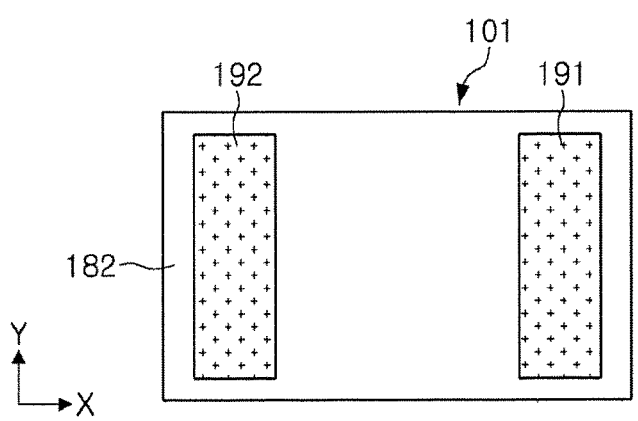

Referring to FIG. 11A, the first and second connection electrode layers 151 and 152 may be formed to be elongated in the X direction and alternately disposed on the first insulating layer 181 in the Y direction. A second insulating layer 182 may be disposed on the first and second connection electrode layers 151 and 152. The second insulating layer 182 may only expose the first or second connection electrode layer 151 or 152 in the Y direction through openings as illustrated in FIG. 11B. Referring to FIG. 11C, the first external electrode 191 maybe disposed to be elongated in the Y direction to cover the exposed first connection electrode layer 151, and the second external electrode 192 may be disposed to be elongated in the Y direction to cover the exposed second connection electrode layer 152.

Figure 12A:
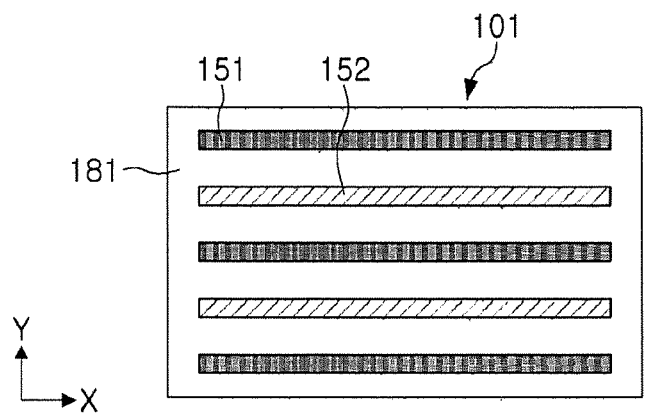
Figure 12B:
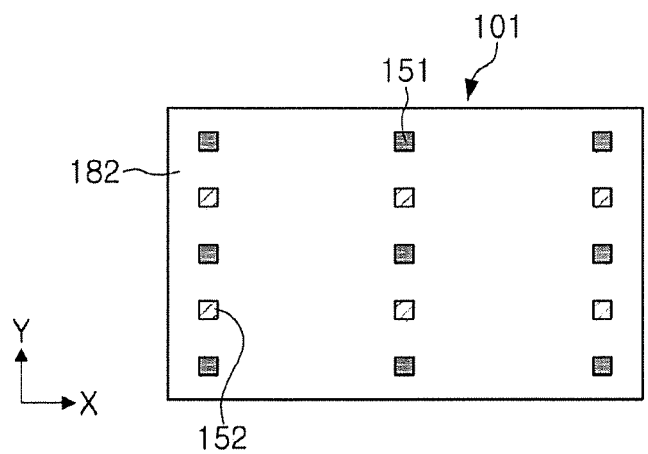
Figure 12C:
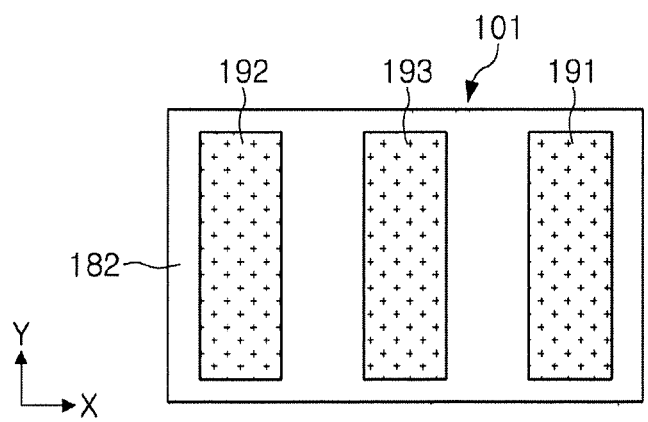

Referring to FIGS. 12A, 12B and 12C, an embodiment in which a capacitor includes external electrodes composed of three terminals may also be implemented. Referring to FIG. 12A, the first and second connection electrode layers 151 and 152 maybe formed to be elongated in the X direction and alternately disposed in the Y direction on the first insulating layer 181. A second insulating layer 182 maybe disposed on the first and second connection electrode layers 151 and 152. The second insulating layer 182 may only expose the first or second connection electrode layer 151 or 152 in the Y direction through openings as illustrated in FIG. 12B. Here, only the second connection electrode layer 152 may be exposed in both end portions of the second insulating layer 182, and only the first connection electrode layer 151 may be exposed in a central portion of the second insulating layer 182. Referring to FIG. 12C, first and second external electrodes 191 and 192 may be disposed to be elongated in the Y direction to cover the exposed second connection electrode layer 152, and a third external electrode 193 may be disposed to be elongated in the Y direction to cover the exposed first connection electrode layer 151.

Figure 13:
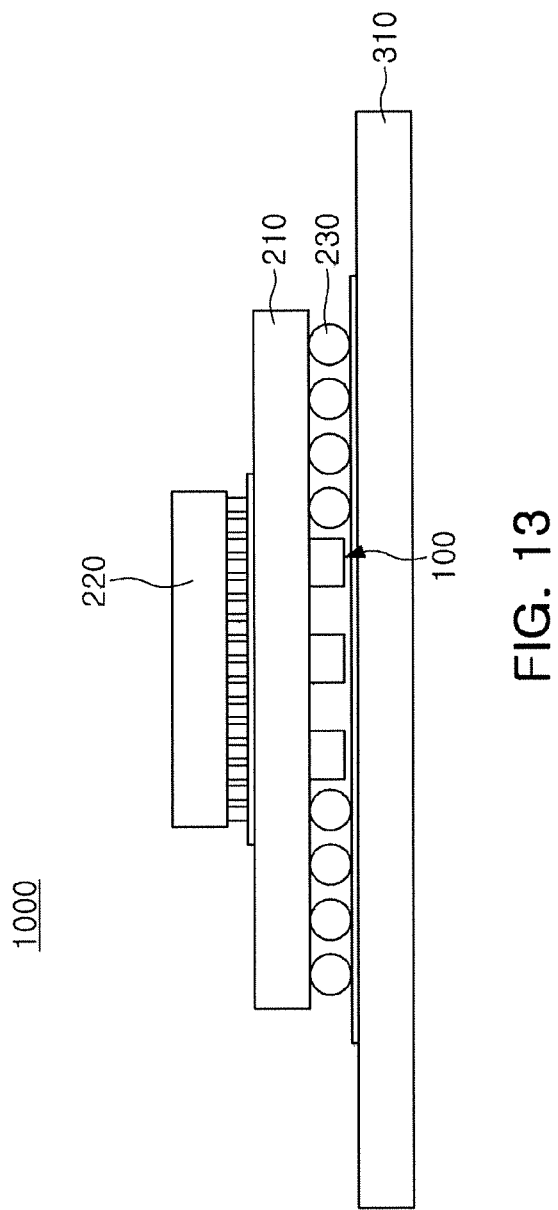
FIG. 13 shows a schematic cross-sectional view illustrating a board having a capacitor according to another exemplary embodiment in the present disclosure.

FIG. 13 shows a schematic cross-sectional view illustrating a board having a capacitor according to another exemplary embodiment in the present disclosure.

Referring to FIG. 13, a board 1000 having a capacitor according to another exemplary embodiment in the present disclosure may include a circuit board 210, a semiconductor chip 220 disposed on one surface of the circuit board 210, and a capacitor 100 disposed on the other surface of the circuit board 210.

Here, as the capacitor 100, the capacitor 100 according to the exemplary embodiment in the present disclosure may be used. The capacitor 100 according to the exemplary embodiment in the present disclosure is a so-called thin-film capacitor. Since the thin-film capacitor has an advantage in that it has low equivalent series inductance (ESL) unlike a multilayer ceramic capacitor according to the related art. Recently, the application of the thin-film capacitor as a decoupling capacitor for an application processor (AP) has been considered. Particularly, in a case in which the capacitor is used as the decoupling capacitor, there is a need to dispose the capacitor to be adjacent to the AP. Therefore, in the board 1000 having a capacitor according to another exemplary embodiment in the present disclosure, the semiconductor chip 220 used as the AP may be disposed on one surface of the circuit board 210, and the capacitor 100 may be disposed on the other surface of the circuit board 210 in a position opposite to the semiconductor chip 220.

The capacitor 100 disposed in the position opposite to the semiconductor chip 220 as described above is referred to as a land-side capacitor (LSC). Since the land-side capacitor (LSC) type capacitor 100 as described above is disposed on the other surface of the circuit board 210 at the position opposite to the semiconductor chip 220, in order to mount the circuit board 210 on a main board 310, there is a need to allow the capacitor to have a thickness less than that of solder balls 230 and to significantly decrease a solder ball removal area by designing the capacitor to be as small as possible.

That is, since in the capacitor 100 according to the exemplary embodiment in the present disclosure, the lead portion of each of the electrode layers has the stepped shape inclined from the margin portion of the cell to the capacitance formation portion, the connection electrode layer may be significantly decreased, such that the solder ball may be formed to be thin.

As set forth above, in the capacitors according to exemplary embodiments in the present disclosure, since the lead portions of respective electrode layers are stacked in the stepped shape inclined from the margin portion of the cell to the capacitance formation portion, the number of the connection electrode layers may be significantly decreased.

While exemplary embodiments have been shown and described above, it will be apparent to those skilled in the art that modifications and variations could be made without departing from the scope of the present invention as defined by the appended claims.

What is claimed is:

1. A capacitor comprising:
 a substrate including a capacitance formation portion including trenches in the substrate, and first and second margin portions disposed on opposite sides of the capacitance formation portion;
 dielectric layers disposed on one surface of the substrate and filling the trenches; and
 first electrode layers and second electrode layers respectively disposed on the dielectric layers, and alternatively stacking on each other,
 wherein the first electrode layers include first lead portions led out from the capacitance formation portion to the first margin portion and second lead portions led out from the capacitance formation portion to the second margin portion,
 the second electrode layers include third lead portions led out from the capacitance formation portion to the first margin portion and fourth lead portions led out from the capacitance formation portion to the second margin portion,
 in the first margin portion, the first lead portions of the first electrode layers and the third lead portions of the second electrode layers are alternately stacked in a stepped shape inclined with respect to the one surface of the substrate,
 in the second margin portion, the second lead portions of the first electrode layers and the fourth lead portions of the second electrode layers are alternately stacked in a stepped shape inclined with respect to the one surface of the substrate, and
 the capacitor further comprises a first connection electrode layer disposed on at least the first margin and being in contact with the first lead portions of the first electrode layers, and a second connection electrode layer disposed on at least the second margin and being in contact with the fourth lead portions of the second electrode layers.

2. The capacitor of claim 1, further comprising a first insulating layer covering the dielectric layers, the first electrode layers, and the second electrode layers,
 wherein the first insulating layer includes first openings exposing the first lead portions and second openings exposing the fourth lead portions.

3. The capacitor of claim 2, wherein each of the first openings is elongatedly disposed to correspond to a boundary between the capacitance formation portion and the first margin portion, and each of the second openings is elongatedly disposed to correspond to a boundary between the capacitance formation portion and the second margin portion.

4. The capacitor of claim 2,
wherein the first connection electrode layer is disposed on the first insulating layer and fills the first openings to electrically connect to the first electrode layers, and
the second connection electrode layer is disposed on the first insulating layer and fills the second openings to electrically connect to the second electrode layers.

5. The capacitor of claim 4, wherein each of the first and second connection electrode layers is an integral continuous layer.

6. The capacitor of claim 1, further comprising:
a second insulating layer disposed on the first and second connection electrode layers and partially exposing the first and second electrode layers.

7. The capacitor of claim 6, further comprising:
a first external electrode covering a portion of the first connection electrode layer exposed from the second insulating layer and electrically connected to the first connection electrode layer; and
a second external electrode covering a portion of the second connection electrode layer exposed from the second insulating layer and electrically connected to the second connection electrode layer.

8. A board, comprising:
a circuit board;
a semiconductor chip disposed on one surface of the circuit board; and
the capacitor of claim 1 disposed on another surface of the circuit board.

9. The board of claim 8, wherein the capacitor is disposed on the another surface of the circuit board in a position opposite to the semiconductor chip.

10. The board of claim 8, wherein the capacitor is a land-side capacitor.

11. The board of claim 10, further comprising:
solder balls,
wherein the capacitor has a thickness less than that of solder balls.

12. A capacitor comprising cells each including a capacitance formation portion including trenches in a substrate and a margin portion disposed around the capacitance formation portion,
wherein each of the cells includes dielectric layers disposed in the capacitance formation portion to be filled in the trenches and first electrode layers and second electrode layers alternately disposed on each other with one of the dielectric layers interposed therebetween, the first electrode layers including first lead portions led out from the capacitance formation portion to the margin portion, the second electrode layers including second lead portions led out from the capacitance formation portion to the margin portion, and the first lead portions and the second lead portions being alternately stacked in a stepped shape inclined with respect to a surface of the substrate.

13. The capacitor of claim 12, wherein the cells include a first cell and a second cell adjacent to each other,
a region in which portions of the margins of the first and second cells come in contact with each other is a first region,
a portion of the margin of the first cell disposed on one side of the first cell opposing another side of the first cell contacting the second cell is a second region,
a portion of the margin of the second cell disposed on one side of the second cell opposing another side of the second cell contacting the first cell is a third region,
the first lead portions of the first and second cells are disposed in the first region, and
the second lead portions of the first cell and the second lead portions of the second cell are disposed in the second and third regions, respectively.

14. The capacitor of claim 13, further comprising a first insulating layer covering the dielectric layers, the first electrode layers, and the second electrode layers, and including first openings disposed in the first region and second and third openings disposed in the second and third regions, respectively.

15. The capacitor of claim 14, wherein each of the first openings is elongatedly disposed to correspond to a boundary between the first and second cells,
each of the second openings is elongatedly disposed to correspond to another boundary of the first cell opposing the boundary between the first and second cells, and
each of the third openings is elongatedly disposed to correspond to another boundary of the second cell opposing the boundary between the first and second cells.

16. The capacitor of claim 14, further comprising:
a first connection electrode layer disposed on the first insulating layer in the first region and filling the first openings to electrically connect to the first lead portions of the first and second cells;
a second connection electrode layer disposed on the first insulating layer in the second region and filling the second openings to electrically connect to the second lead portions of the first cell; and
a third connection electrode layer disposed on the first insulating layer in the third region and filling the third openings to electrically connect to the second lead portions of the second cell.

17. The capacitor of claim 16, wherein each of the first to third connection electrode layers is an integral continuous layer.

18. The capacitor of claim 16, further comprising:
a second insulating layer disposed on the first to third connection electrode layers and partially exposing the first to third connection electrode layers.

19. The capacitor of claim 18, further comprising:
a first external electrode covering a portion of the first connection electrode layer exposed from the second insulating layer and electrically connected to the first connection electrode layer;
a second external electrode covering portions of the second and third connection electrode layers exposed from the second insulating layer and electrically connected to the second and third connection electrode layers.

20. A capacitor comprising:
a substrate including a plurality of trenches, a capacitance formation portion, and a margin portion disposed around the capacitance formation portion;
dielectric layers disposed on one surface of the substrate and filling the plurality of trenches;
a plurality of first electrode layers each disposed on one surface of the dielectric layers and each including a first lead portion led out from the capacitance formation portion to the margin portion; and
a plurality of second electrode layers each disposed on one surface of the dielectric layers and each including a second lead portion led out from the capacitance formation portion to the margin portion, the plurality of first electrode layers and the plurality of second electrode layers being alternatively disposed with one of the dielectric layers interposed therebetween, wherein the first lead portion and the second lead portion are alternately stacked in a stepped shape inclined in a direction from the margin portion to the capacitance formation portion, and a single connection electrode layer is connected to the plurality of first electrode layers or to the plurality of second electrode layers.

* * * * *